(12) United States Patent
Hoefler et al.

(10) Patent No.: US 9,407,263 B2
(45) Date of Patent: Aug. 2, 2016

(54) METHOD AND APPARATUS FOR A TUNABLE DRIVER CIRCUIT

(71) Applicant: FREESCALE SEMICONDUCTOR, INC., Austin, TX (US)

(72) Inventors: Alexander B. Hoefler, Austin, TX (US); Hector Sanchez, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 443 days.

(21) Appl. No.: 13/665,864

(22) Filed: Oct. 31, 2012

(65) Prior Publication Data

US 2014/0117953 A1 May 1, 2014

(51) Int. Cl.
*H03K 19/00* (2006.01)
*H03K 19/003* (2006.01)

(52) U.S. Cl.
CPC ...... *H03K 19/0013* (2013.01); *H03K 19/00384* (2013.01); *Y10T 29/49155* (2015.01)

(58) Field of Classification Search
CPC .................. H03K 19/01721; H03K 19/0963; H03K 19/0016; H03K 19/00361; H03K 19/018521; H03K 2005/00039; H03K 2005/00097; H03K 2005/00286; H03K 17/0822; H03K 17/102; H03K 17/166; G05F 1/56; H01L 21/82
USPC ............... 326/21, 26–27, 82–83, 86–87, 112, 326/119, 104–105; 327/108–109, 112
See application file for complete search history.

(56) References Cited

U.S. PATENT DOCUMENTS

| | | | | |
|---|---|---|---|---|
| 5,121,013 A | * | 6/1992 | Chuang et al. | 326/26 |
| 5,233,238 A | * | 8/1993 | Mattos | H03K 5/133 326/27 |
| 5,717,343 A | * | 2/1998 | Kwong | H03K 19/00361 326/121 |
| 5,760,610 A | * | 6/1998 | Naffziger | 326/93 |
| 5,877,647 A | * | 3/1999 | Vajapey et al. | 327/391 |
| 5,894,238 A | * | 4/1999 | Chien | 327/112 |
| 6,130,563 A | * | 10/2000 | Pilling | H03K 17/164 327/111 |
| 6,359,484 B1 | * | 3/2002 | Ajit | H03K 17/166 327/170 |
| 6,686,763 B1 | * | 2/2004 | Yen | 326/30 |
| 7,567,096 B2 | | 7/2009 | Mohammad et al. | |
| 7,928,756 B1 | * | 4/2011 | Lu et al. | 326/27 |
| 8,143,917 B2 | | 3/2012 | Jang et al. | |

(Continued)

OTHER PUBLICATIONS

Byung-Do Yang; Lee-Sup Kim, High-speed and low-swing on-chip bus interface using threshold voltage swing driver and dual sense amplifier receiver, ESSCIRC 2000.

(Continued)

*Primary Examiner* — Jany Richardson

(57) ABSTRACT

A driver circuit having an adjustable output signal includes a logic circuit configured to receive an input signal into a first input terminal and an output circuit coupled to the logic circuit, wherein the output circuit is configured to generate, at an output terminal of the output circuit, an output signal having a signal level that changes in response to a signal level of the input signal. The driver circuit further includes a feedback circuit coupled to a second input terminal of the logic circuit. The feedback circuit includes first and second gate terminals coupled to the output terminal and a third gate terminal coupled to a control signal supply, wherein the feedback circuit is configured to control a maximum level of the output signal from the driver circuit based on an operating threshold of the feedback circuit as set by a control signal generated by the control signal supply.

20 Claims, 6 Drawing Sheets

(56) References Cited

U.S. PATENT DOCUMENTS

2008/0106299 A1*  5/2008  Oh ................................. 326/33
2009/0230992 A1*  9/2009  Ha ................................. 326/63
2014/0313844 A1* 10/2014  Lin ....................... H03K 5/003
                                                        365/230.01

OTHER PUBLICATIONS

Golshan, R.; Haroun, B., A novel reduced swing CMOS bus interface circuit for high speed low power VLSI systems, ISCAS 1994.

* cited by examiner

METHOD AND APPARATUS FOR A TUNABLE DRIVER CIRCUIT

FIELD

The present disclosure relates generally to low signal complementary-metal-oxide-semiconductor (CMOS) swing buffers or driver circuits as a technique to reduce dynamic power consumption in digital circuits. It is more particularly related to a method and driver circuit having an adjustable or variable output signal margin that is tunable or controlled using a voltage source external to the driver circuit.

BACKGROUND

Low signal swing buffers or driver circuits, meaning circuits that provide an output signal that is used to control other downstream circuits or components, are an emerging technique to reduce dynamic power consumption in digital circuits. They achieve a dynamic power reduction by driving a load capacitance by an upper voltage swing that is smaller than a full rail power supply voltage, VDD. However, a low signal swing on an interconnect line can cause circuit failures if the signal does not develop sufficient voltage margin to the trip point of downstream gate(s). As a consequence, there is a need to be able to control the voltage swing to meet specific applications and provide an acceptable noise margin, or equivalently an acceptable signal margin.

Prior art circuits have addressed this need but have shortcomings. For example, one circuit uses a level shifter/receiver that is source coupled to achieve a low signal swing, and this results in a conductive input. Conductive inputs result in power dissipation, cause capacitors to discharge, and can't be used in dynamic circuits. Another circuit does not have any external control mechanism, which prevents the circuit from being specifically tuned. Another circuit describes controlling a voltage output swing in every cell with a set of discrete discharge transistors in that same cell, that are enabled by a set of digital control signals. However, this circuit requires several digital control signals to set the voltage level, and the circuit overhead is too high for standard applications. Yet another circuit describes the direct control of output voltage through control of the regulated power supply voltage of the driver circuit.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
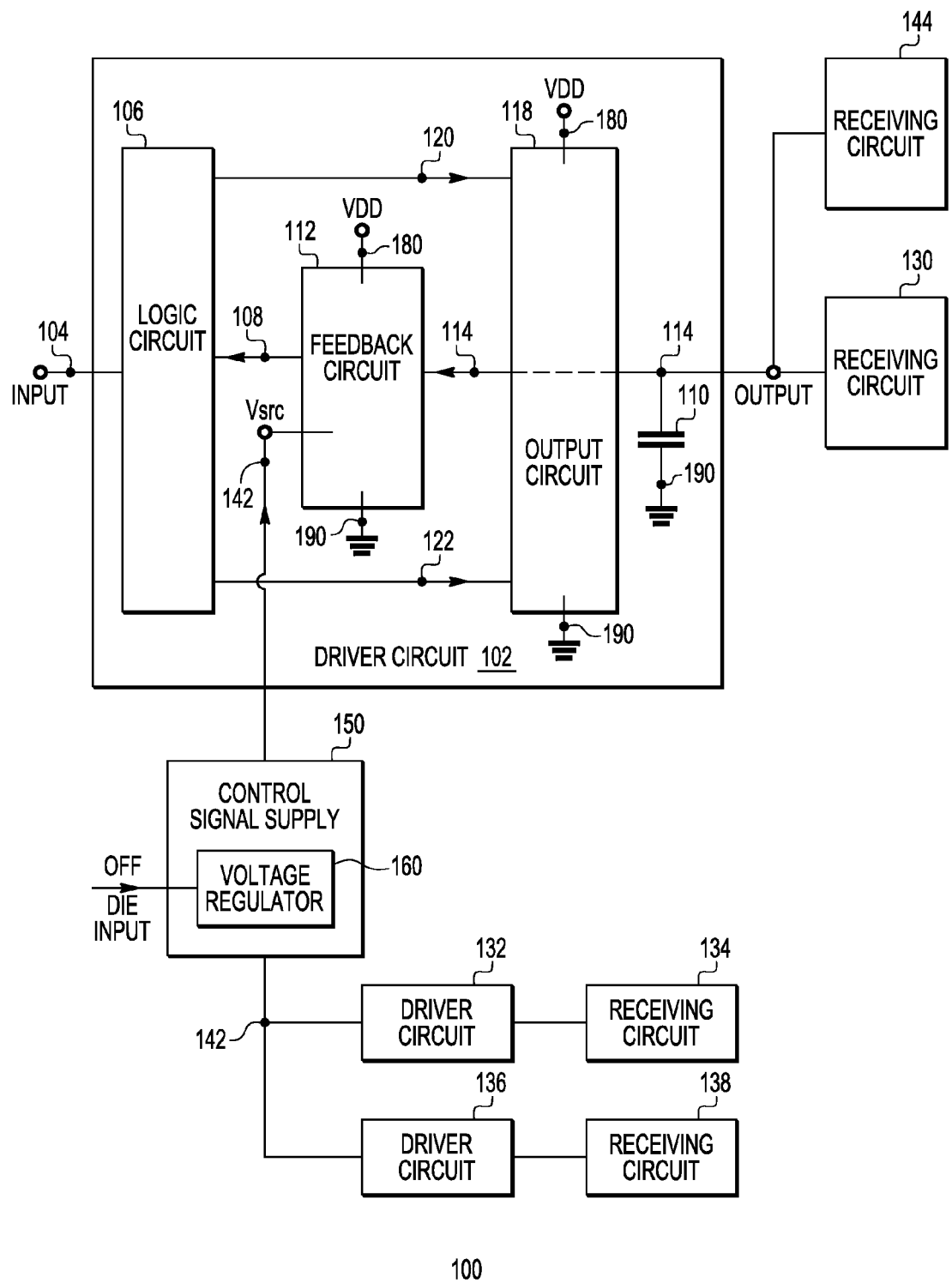
FIG. 1 is a generalized block diagram illustrating an integrated circuit (IC) that includes driver circuits having a tunable output signal level, in accordance with an embodiment.

The present invention is illustrated by way of example, and its not limited by the accompanying figures, in which like references indicate similar elements. Skilled artisans will appreciate that elements in the figures are illustrated for simplicity and clarity and have not necessarily been drawn to scale. For example, the dimensions of some of the elements in the figures may be exaggerated relative to other elements to help improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein. Also, the functions included in the flow diagrams do not imply a required order of performing the functionality contained therein.

DETAILED DESCRIPTION

In accordance with an embodiment of the present disclosure is a method for controlling an output signal for a driver circuit. The method includes receiving, into a driver circuit, an input signal, and generating, by the driver circuit, an output signal having a signal level that changes in response to a signal level of the input signal. The method further includes receiving the output signal into first and second gate terminals of a feedback circuit for the driver circuit, and receiving a control signal into a third gate terminal of the feedback circuit, wherein the control signal sets an operating threshold of the feedback circuit in order to control a maximum level of the output signal from the driver circuit.

In accordance with another embodiment of the present disclosure is a driver circuit having an adjustable output signal. The driver circuit includes a logic circuit, an output circuit coupled to the logic circuit, and a feedback circuit coupled to a second input terminal of the logic circuit, the latter controlled by a control signal supply containing an on chip voltage regulator or regulated voltage source. The logic circuit is configured to receive an input signal into a first input terminal. The output circuit is configured to generate, at an output terminal of the output circuit, an output signal having a signal level that changes in response to a signal level of the input signal. The feedback circuit comprises first and second gate terminals coupled to the output terminal to receive the output signal and a third gate terminal coupled to the control signal supply to receive a control signal. The feedback circuit is configured to control a maximum level of the output signal from the driver circuit based on an operating threshold of the feedback circuit as set by the control signal generated by the control signal supply. More particularly, an embodiment involves programming a desired voltage level (control signal) into the on chip voltage regulator that is contained in the control signal supply. This control signal sets the operating threshold of the feedback circuit in order to control a maximum level of the output signal from the driver circuit.

In a further embodiment, the IC containing the driver circuit further includes first and second voltage supplies coupled to the feedback circuit. The first voltage supply is configured to provide a first supply voltage level, VDD, and the second voltage supply is configured to provide a second voltage supply level, VSS, which in one illustrative implementation is "virtual ground" or a virtual ground voltage level, which means a voltage level that is lower than VDD. Accordingly, in an embodiment, the driver circuit is configured to generate an output signal comprising a voltage level that ranges from the virtual ground voltage level to the maximum level of the output signal, which is less than the first supply voltage level. Moreover, with respect to the corresponding method, generating the output signal comprises generating an output signal comprising a voltage level that ranges between the maximum level of the output signal, which is less than a first supply voltage level for the driver circuit, and a second supply voltage level for the driver circuit, which in one embodiment is virtual ground.

FIG. 1 is a block diagram of an embodiment of a system 100 to control a voltage swing of at least one driver circuit within the system. For example, system 100 is an IC manufactured using a manufacturing process, such as a CMOS manufacturing process, in accordance with the present teachings illustrated and described, for instance, with respect to FIG. 6. System 100 comprises multiple driver circuits 102, 132 and 136 each, respectively, coupled to at least one receiving circuit, which can be or include, for example, a high-power switch or transistor, a logic circuit, another driver circuit, a set of serially connected driver circuits, a set of parallel connected driver circuits, or a mix of a set of serially connected and a set of parallel connected driver circuits, which are connected to other circuits, etc. As illustrated, the driver circuit 102 is connected to receiving circuits 130 and 144. The driver circuit 132 is connected to receiving circuit 134. The driver circuit 136 is connected to receiving circuit 138. Accordingly, a driver circuit can be connected to one or multiple receiving circuits. Moreover, alternative arrangements can be envisioned for system 100. For example, system 100 could include a single driver circuit connected to one or more receiving circuits or multiple driver circuits each connected to a single receiving circuit. In a further alternative arrangement, multiple instances of system 100 can be included on the same IC chip.

The driver circuits provide an output signal at an output terminal (e.g., at a node 114), which is used to drive or switch on and off one or more components within the one or more receiving circuits to which it is coupled, such as one or more transistors. The output signal of each driver circuit in system 100 could be the same or different depending on the circuit topologies. In an embodiment, the output signal from the driver circuit (e.g., 102, 132, or 136) is used to drive the gate of one or more transistors of the receiving circuit or circuits (e.g., 130, 134, 138, 144) coupled thereto. In accordance with the present teachings, a method and driver circuit is provided that controls the output signal swing (i.e., output signal margin) of each driver circuit such that the output signal is optimally less than VDD rail but exceeds a maximum operating threshold of all the receiving circuits to which that particular driver circuit is coupled. In other words, for each driver circuit, the maximum output signal level still remains less than a maximum rail voltage, VDD, supplied to the driver circuit but is larger than a voltage signal needed to switch transistors within the one or more receiving circuits connected to the driver circuit.

Each driver circuit includes a logic circuit (e.g., 106), a feedback circuit (e.g., 112), and an output circuit (e.g., 118), which are operatively and communicatively coupled as shown in FIG. 1. Each driver circuit further includes a capacitive load 110 coupled to the output terminal of the driver circuit. The physical couplings between the elements of the driver circuit 102 and the elements of the system 100 (shown as signal lines) represent physical connections created between these elements during manufacturing, such as metal (e.g., aluminum, copper, gold, etc.) trace lines manufactured on an IC during the IC fabrication process. The arrows on the signal lines indicate direction of signal flow from an IC or circuit element providing a signal to an IC or circuit element receiving the signal. Moreover, the details of each driver circuit are shown and described by reference to the driver circuit 102 for simplicity of illustration, but the description applies equally to driver circuits 132 and 136.

More particularly, the logic circuit 106 includes a first input terminal, at a node 104, that receives an input signal, such as a clock signal, which transitions between a low state, e.g., 0 volts (V), and a high state, e.g., 1.1 V, during system operation. The output circuit 118 is coupled to the logic circuit at nodes 120 and 122. The output circuit 118 is configured to generate, at the output terminal of the output circuit (at node 114), an output signal having a signal level that changes in response to a change in a signal level of the input signal received into the input terminal (at node 104). The capacitive load, represented by a single capacitor 110 but that can be any capacitive load, including a parasitic capacitive load, has a first terminal coupled to the output terminal, at the node 114, to receive the output signal. The feedback circuit 112 is coupled between the output circuit 118, at node 114, and a second input terminal of the logic circuit 106, at a node 108.

System 100 further includes first and second voltage supplies (not shown). The first voltage supply is configured to provide a first supply voltage level, VDD, at a node 180 to the feedback circuit 112 and the output circuit 118. The second voltage supply is configured to provide a second supply voltage level, VSS, at a node 190. In an embodiment, the second supply voltage level is virtual ground or a virtual ground voltage level having a magnitude less than VDD, such as electrical ground as shown in FIG. 1. Moreover, as shown, the second terminal of the capacitor 110 is connected to the electrical ground at node 190, as well as the output circuit 118 and the feedback circuit 112.

Further included in system 100 is an "on-chip" control signal supply 150. In an embodiment, the control signal supply 150 comprises a voltage regulator circuit 160 located on a same integrated circuit chip with the driver circuit (e.g., 102, 132, 136). During one embodiment of system 100 operation, the voltage regulator 160 receives an "off-die" (i.e., external to the system 100) input signal and generates therefrom a control signal (in this case a voltage, Vsrc), which it provides to the feedback circuit 102 at a node 142. In accordance with the present teachings, Vsrc is tunable in order to adjust an operating threshold of the feedback circuit 112 in order to control a maximum level of the output signal from the driver circuit 102.

More particularly, Vsrc is set such that the maximum level of the output signal is high enough to meet an operating threshold requirement of both of the receiving circuits 130 and 144 coupled to the output terminal of the driver circuit 102. The receiving circuit operating threshold, in one embodiment, is a threshold voltage of one or more transistor gates within the receiving circuit. In accordance with this embodiment, the maximum level of the output signal is greater than an operating threshold of each receiving circuit coupled to the driver circuit. Thus, the driver circuit is formed on an integrated circuit and is coupled to the control signal supply and to at least first receiving circuit formed on the integrated circuit and having a first receiving circuit operating threshold, wherein the control signal supply is configured to generate the control signal having an amplitude that causes the maximum level of the output signal of the driver circuit to be greater than (or at least the same as) the first receiving circuit operating threshold and the same as or greater than a maximum operating threshold of all of the receiving circuits connected to the driver circuit.

In a further embodiment, as illustrated by reference to FIG. 1, a single control signal supply, e.g., 150, provides the control signal Vsrc to more than one driver circuit, at the node 142. For simplicity, FIG. 1 illustrates the control signal supply 150 coupled to three such driver circuits 102, 132, 136 on the same system 100. However, the control signal supply could be coupled to additional driver circuits on the system 100 or to additional driver circuits on one or more other ICs within the same packaging or on the same circuit board as the system 100. Moreover, each driver circuit would, in turn, be coupled to at least one receiving circuit each having a corresponding receiving circuit operating threshold. In such a case, the control signal supply 150 is configured to generate a Vsrc that enables a maximum voltage level at the output of each driver circuit that is the same as or exceeds the highest operating threshold of the receiving circuit operating thresholds for the one or more (i.e., set) of receiving circuits connected to the driver circuit. For instance, for the embodiment having multiple driver circuits located on the same chip, the integrated circuit that contain the (first) driver circuit (e.g., 102) also contains at least one other driver circuit (e.g., 132, 136) coupled to the control signal supply (e.g., 150) and at least one receiving circuit (e.g., 134, 138) coupled to each of the other driver circuits and having corresponding receiving circuit operating threshold. In this case, the control signal supply is configured to generate the control signal having an amplitude that causes a maximum level of an output signal of each driver circuit to be the same as or greater than the maximum of all of receiving circuit operating thresholds.

In one example implementation, the voltage regulator 160 comprises at least one programmable electrical fuse (eFUSE) or non-volatile memory storage element that can be programmed at circuit test using the off-die input signal. The use of programmable elements to provide the control signal Vsrc enables the generation of driver circuit output signals that are lower than VDD rail but high enough to trigger downstream gates and that further enables a chip dependent control signal to be stored on the circuit die that accounts for IC process variations, varying temperature environments, etc. In this manner, the control signal supply is configured to generate a die-specific control signal; and a level of the control signal is based on at least one of manufacturing process characteristics or operating environment characteristics of an integrated circuit chip housing the driver circuit. In a further embodiment, the voltage regulator (and hence Vsrc and the corresponding driver circuit output signals) is programmable or tunable for multiple ICs. In yet a further embodiment, receiving the control signal comprises receiving a continuous level or amplitude control signal. This allows continuous tuning of the driver circuit maximum level output signal using an external reference voltage, meaning a reference voltage that is external to the driver circuit but that can be on the same integrated circuit (IC) chip as the driver circuit.

Figure 2:
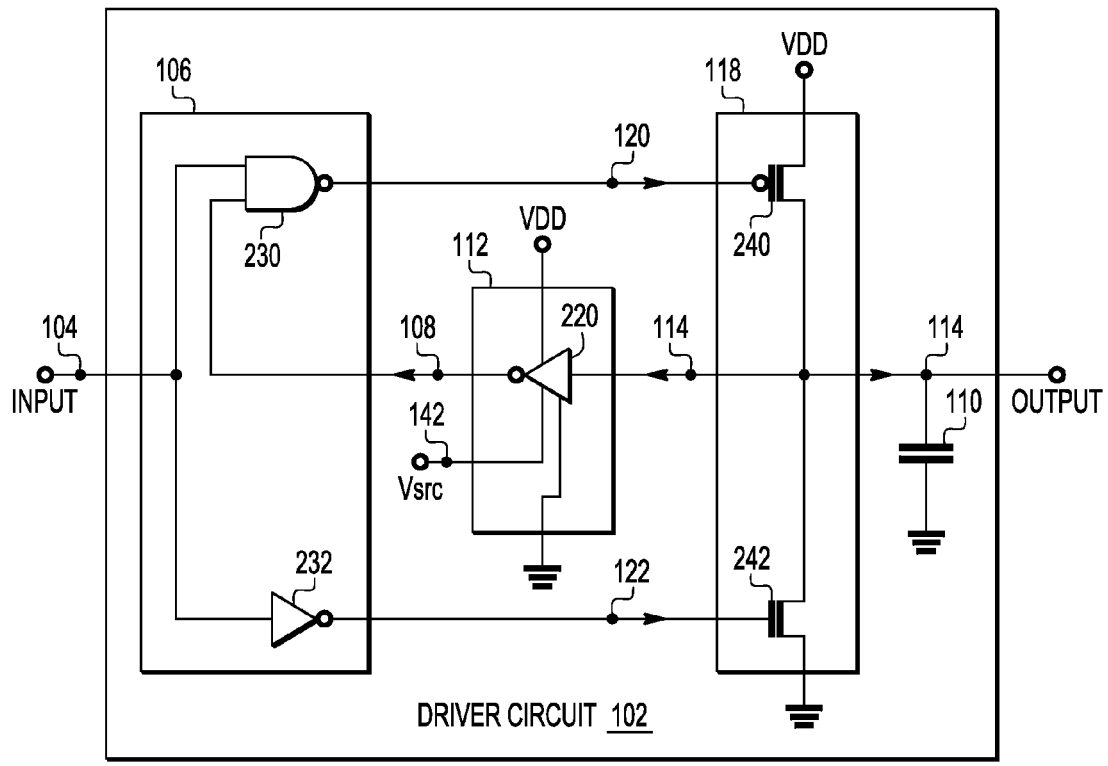
FIG. 2 is a circuit diagram illustrating a driver circuit having a tunable output signal level, in accordance with an embodiment.
Figure 3:
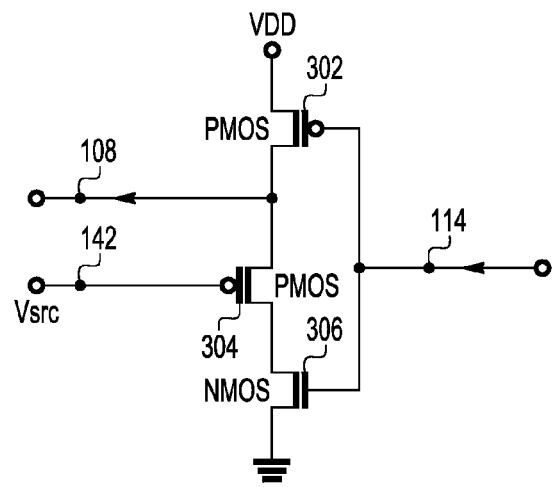
FIG. 3 is a circuit diagram illustrating a tunable feedback circuit for use in a driver circuit, in accordance with an embodiment.

FIGS. 2 and 3 illustrate one embodiment of a driver circuit in accordance with the present teachings. Driver circuit 102 is shown and described, but the description applies equally to the driver circuits 132 and 136 shown in FIG. 1. As will be described in detail, the circuit 102 comprises only gate-coupled inputs for the feedback circuit and the output circuit. A benefit of such coupling is that the control signal, Vsrc, provided to the feedback circuit 112 is also gate coupled and, therefore, has very little static power consumption. Another benefit of the disclosed circuit arrangement is that Vsrc is easily generated by an on-chip voltage regulator circuit that is set to a die-specific value that that accounts for IC process variations, varying temperature environments, etc.

Turning now to the details of the feedback 112, logic 106, and output 118 circuits of the driver circuit 102 shown in FIG. 2. The feedback circuit comprises a (first) inverter (220) having an input comprising first and second gate terminals coupled to the output terminal, at node 114, a third gate terminal coupled to the control signal supply, and an output coupled to the second input of the logic circuit 106, at node 108. In the embodiment shown by reference to FIG. 3, the (first) inverter 220 comprises a first transistor 302, a second transistor 306, and a third transistor 304. The first and third transistors comprise p-channel metal oxide semiconductor (PMOS) transistors, and the second transistor comprises an n-channel metal oxide semiconductor (NMOS) transistor.

The first transistor 302 includes the first gate terminal coupled to the output terminal at node 114, a first (source) terminal coupled to a first voltage supply to receive VDD, and a second (drain) terminal comprising the output of the inverter coupled to the second input of the logic circuit, at the node 108. The second transistor 306 includes the second gate terminal coupled to the output terminal at node 114, a first (source) terminal coupled to a second voltage supply (in this case electrical ground), and a second (drain) terminal. The third transistor 304 includes the third gate terminal coupled to the control signal supply at the node 142 to receive Vsrc, a first (source) terminal coupled to the second (drain) terminal of the first transistor 302, and a second (drain) terminal coupled to the second (drain) terminal of the second transistor 306.

Turning back to the description of the driver circuit 102, the logic circuit 106 comprises a NAND logic gate 230 comprising the first and second input terminals of the logic circuit, at nodes 104 and 108, respectively, and an output at the node 120, and a second inverter 232 having an input coupled to the first input terminal of the NAND gate and having an output at the node 122. The output circuit includes fourth and fifth transistors 240 and 242, respectively. In this embodiment, the fourth transistor 240 comprises a p-channel metal oxide semiconductor transistor, and the fifth transistor 242 comprises an n-channel metal oxide semiconductor transistor, with the gates driven independently of each other. More particularly, the fourth transistor has a first terminal (source) coupled to the first voltage supply to receive VDD, a gate terminal coupled to the output of the NAND logic gate 230 at the node 120, and a second (drain) terminal that is or serves as the output terminal of the output circuit at the node 114. The fifth transistor has a first (source) terminal coupled to the second voltage supply (in this case electrical ground), a gate terminal coupled to the output of the second inverter 232, at the node 122, and a second (drain) terminal coupled to the second (drain) terminal of the fourth transistor 240.

Figure 4:
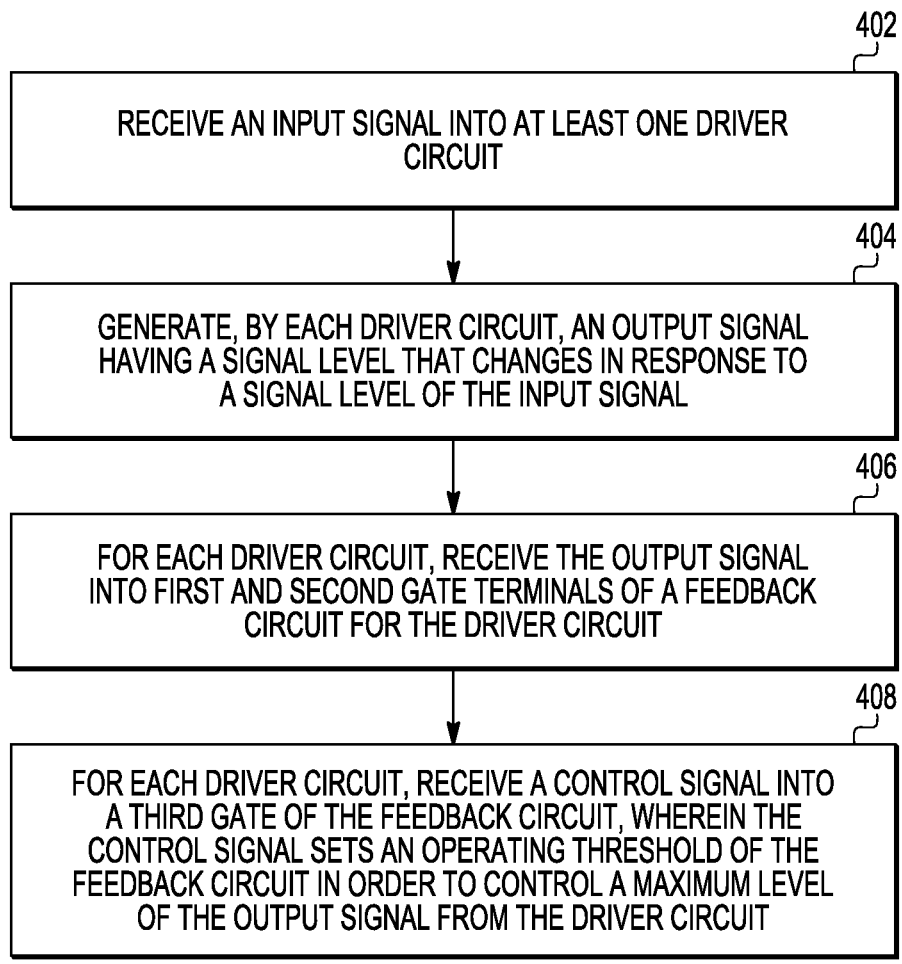
FIG. 4 illustrates a flow diagram of a method of operation for a driver circuit, in accordance with an embodiment.

The operation of the driver circuit 102, in general, is next described by reference to a flow diagram 400 shown in FIG. 4. At 402, an input signal is received into one or more driver circuits on one or more ICs. Each driver circuit generates, at 404, an output signal having a signal level that changes in response to a signal level of the input signal. In this example implementation, the driver circuit 102 receives an input signal at the node 104 and, responsively, generates an output signal at the node 114. More particularly, when the input signal is in a low state: the NAND gate output at the node 120 into the gate of the PMOS transistor 240 is high, and the PMOS transistor 240 is off. Additionally, when the input signal at node 104 is in the low state, the output of the inverter 232 is high at the node 122, and the NMOS transistor is on, such that the output signal at the node 114 is pulled low to VSS, which in this case is electrical ground. This low output signal, at the node 114, is received (at 406) into first and second gate terminals of transistors 302 and 306 of the feedback circuit 112, which comprises the inverter 220. In response to receiving the low state output signal, the inverter 220 generates a high output, at the node 108, which is provided to the second input of the NAND gate 230.

Consequently, when the input signal at the node 104 goes high enough to trigger activation of the NAND logic gate 230, the output at the node 120 goes low, since node 108 is also at a high state. A low input into the gate of the PMOS transistor 240 turns on this transistor. Once turned on, the PMOS transistor 240 begins to conduct and charge the capacitor 110 toward VDD. Charging continues until the output signal crosses the trip point (also referred to herein as the operating threshold) of the feedback circuit 112, in this case the inverter 220. In which case, the inverter 220 in effect "senses" a high state of the output signal at its gate inputs and provides a low state at its output, at the node 108. This low state at one of the inputs of the NAND gate 230 and the high state at the other input of the NAND gate 230 causes the NAND gate 230 to transition to a high state at the node 120. This turns off the PMOS transistor 240, thereby holding the output signal, at the node 114, at some level or value between the operating threshold of the inverter 220 and VDD rail, wherein this value is referred to herein as the maximum level of the output signal.

The capacitor 110 remains charged to the maximum level of the output signal until the input signal at the node 104 again switches to the high state. This turns on the NMOS transistor 242 and discharges the capacitor 110 to VSS. Such driver circuit operation characterizes a "half swing buffer" that has an output signal that ranges from VSS rail (in this case electrical ground) to a maximum value of less than or equal to VDD rail depending on the value of Vsrc received, at 408, into the gate of the PMOS transistor 304 of the inverter 220.

In further accordance with the present teachings, the control signal Vsrc is used to change the responsiveness of the inverter 220 (and hence the responsiveness of the feedback loop between the logic circuit 106 and the output circuit 118) in order to set the maximum level of the output signal at the node 114. Vsrc can be set (i.e., raised) to "slow down" the feedback loop by "weakening" the inverter 220 so that it switches or is triggered later, to thereby increase the maximum level of the output signal from the driver circuit 102. Conversely, Vsrc can be set (i.e., lowered) to "speed up" the feedback loop by "strengthening" the inverter 220 so that it switches or is triggered earlier, to thereby decrease the maximum level of the output signal from the driver circuit 102. The tuning of the operating threshold or trigger point of the inverter 220 is described by reference to the inverter topology shown in FIG. 3.

As shown in FIG. 3, the third additional PMOS transistor 304, which is gate coupled to Vsrc, is used to tune the operating threshold or trip point (i.e., the switching level), and therefore the switching delay time between node 114 and node 108, of inverter 220. The switching level and delay time of the feedback circuit 112 is determined by the value of the control signal, Vsrc, at the node 142 as follows. As described above, during the early stage of operation of the driver circuit, the PMOS transistor 240 turns on, and drives node 114 to a voltage level closer to VDD. When node 114 rises, NMOS transistor 306 in inverter 220 gradually turns on, while PMOS transistor 302 gradually turns off. Therefore, node 108 gradually is forced to the VSS level. Referring to the inverter 220, the degree to which node 108 can be forced to VSS depends on how easily node 108 can get discharged through the serial connection of NMOS transistor 306 and PMOS transistor 304. This depends on the degree to which PMOS transistor 304 is turned on. The degree to which PMOS transistor 304 is turned on, however, is controlled by the voltage level of control signal Vsrc. Therefore, the time to discharge node 108, and therefore the effective trip point of inverter 220, depends on the voltage level of controls signal Vsrc. Generally, the lower the voltage level of control signal Vsrc, the more conductive PMOS transistor 304 becomes, and therefore the faster the serial connection of PMOS transistor 304 and NMOS transistor 306 is able to discharge node 114. In an embodiment, the value Vsrc of is equal to the value of VDD. This greater tuning flexibility comes at a minimum die area overhead as a consequence of including an additional PMOS transistor 304 to the inverter 220.

In an alternate embodiment of the inverter 220 of the feedback circuit 112 (not shown), the PMOS transistor 304 is replaced by an NMOS transistor 304, wherein the source of the NMOS transistor 304 is directly connected to node 108, and the drain of the NMOS transistor 304 is connected to the drain of the NMOS transistor 302. Accordingly, in this alternate embodiment, the (first) inverter 220 comprises a first transistor 302, a second transistor 306, and a third transistor 304. The first transistor comprises a p-channel metal oxide semiconductor transistor, and the second and third transistors comprise n-channel metal oxide semiconductor transistors. The first transistor 302 includes the first gate terminal coupled to the output terminal at node 114, a first (source) terminal coupled to a first voltage supply to receive VDD, and a second (drain) terminal. The second transistor 306 includes the second gate terminal coupled to the output terminal at node 114, a first (source) terminal coupled to a second voltage supply (in this case electrical ground), and a second (drain) terminal comprising the output of the inverter coupled to the second input of the logic circuit, at the node 108. The third transistor 304 includes the third gate terminal coupled to the control signal supply at the node 142 to receive Vsrc, a first (drain) terminal coupled to the second (drain) terminal of the first transistor 302, and a second (source) terminal coupled to the second (drain) terminal of the second transistor 306.

Figure 5:
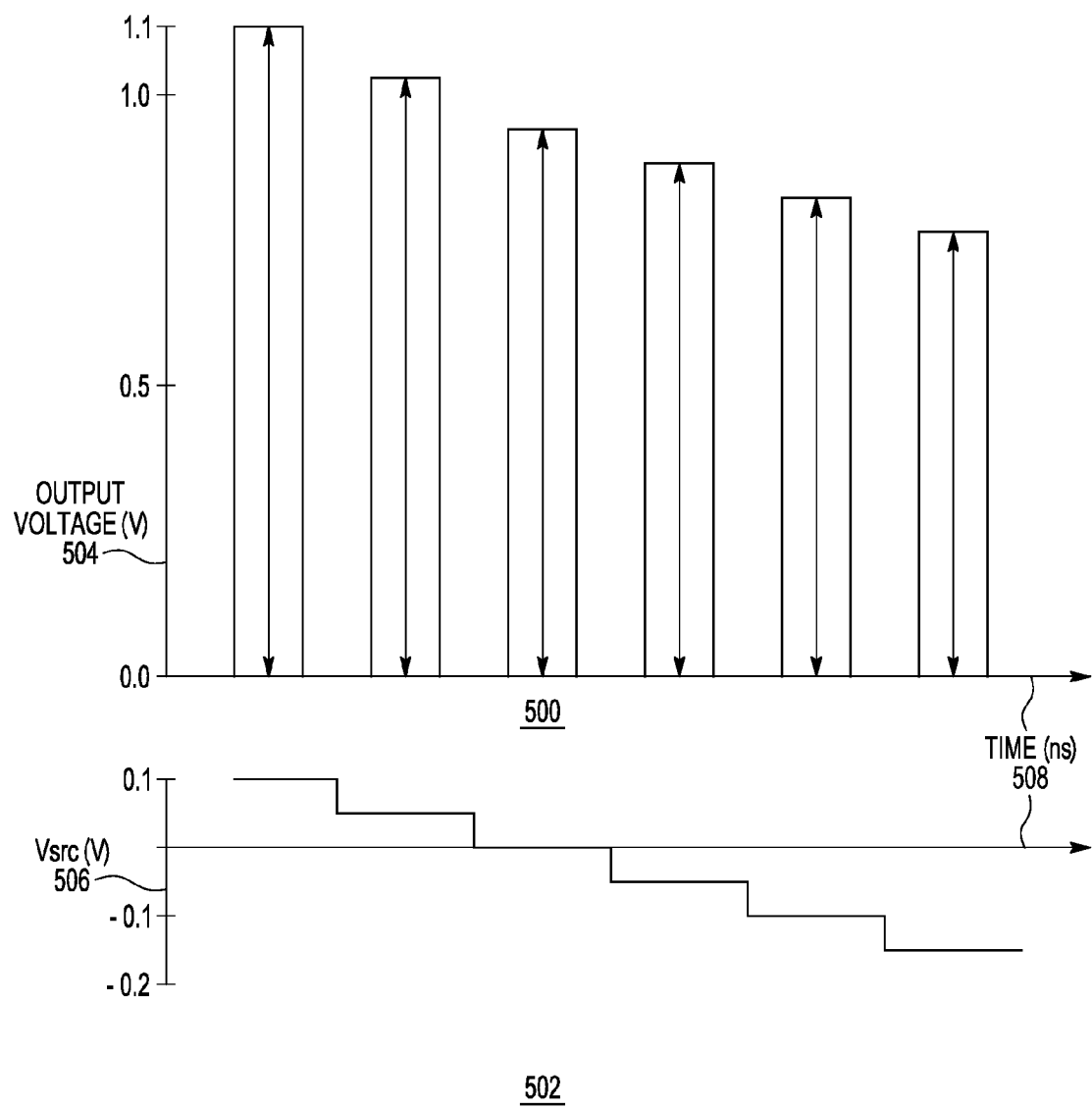
FIG. 5 is a diagram depicting possible variations in the maximum voltage level output of the signal swing of a driver circuit, in accordance with an embodiment.

FIG. 5 illustrates plots 500 and 502 collectively showing different values of an output voltage of a driver circuit, such as the driver circuit 102 in accordance with the present teachings, as the control signal voltage, Vsrc, changes. The output voltage is shown on an axis 504 of plot 500, in volts (V). Vsrc is shown on an axis 506 of plot 502, in volts. Time is shown along an axis 508 of plots 500 and 502 in any suitable unit of time such as nanoseconds. As illustrated in plot 500, the output voltage swings between a ground potential of value 0 V and a high or maximum level as determined by the control signal Vsrc. More particularly, when Vsrc is about 100 mV, the output voltage is at VDD rail. As Vsrc is decreased, the output voltage decreases. Vsrc can be tuned or set during circuit testing such that Vsrc is large enough to generate a large enough output voltage, at the node 114, to activate conduction of the downstream gates coupled to receive the output voltage.

Figure 6:
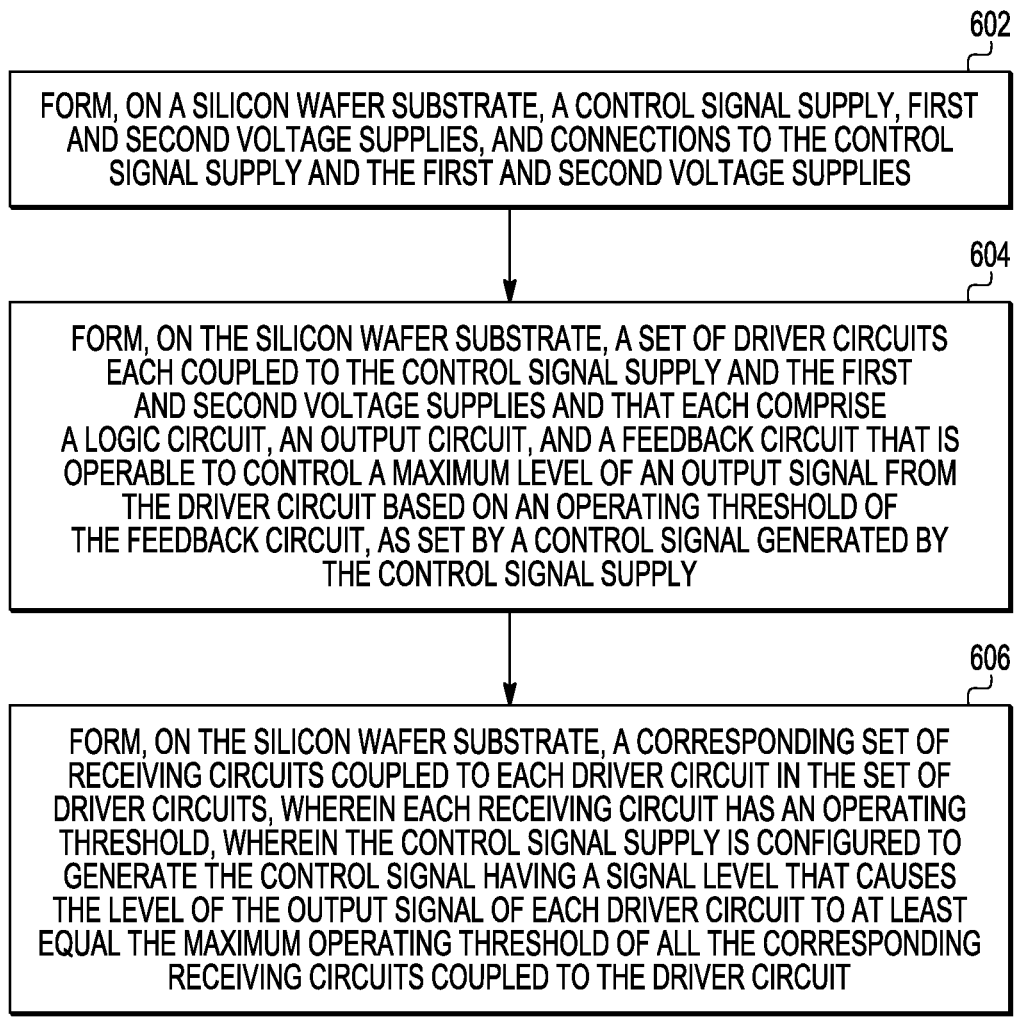
FIG. 6 illustrates a flow diagram of a method of manufacturing a driver circuit, in accordance with an embodiment.

FIG. 6 illustrates a method 600 for manufacturing an integrated circuit on a substrate containing one or more driver circuits each having an adjustable output signal, in accordance with the teachings herein. In an embodiment, the integrated circuit is fabricated using any suitable semiconductor manufacturing process 600 including a CMOS fabrication process. A variety of integrated circuit materials may be used, e.g., metals (such as aluminum, copper, gold, etc.), polysilicon, silicon dioxide, silicon nitride, silicon, and the like, to fabricate the IC. Process 600 can be used to fabricate any of the circuits illustrated and described above by reference to FIGS. 1-3.

The manufacturing process 600 starts with a silicon wafer substrate. At 602, the process 600 includes forming the control signal supply that provides Vsrc, the first and second voltage supplies that provide VDD and VSS, and connections to the control signal supply and the first and second supplies on the substrate. At 604, process 600 comprised forming a set of (i.e., one or more) driver circuits on the substrate, wherein each driver circuit is coupled to the control signal supply and the first and second voltage supplies. As shown and described above by reference to FIG. 1, for example, each driver circuit comprises a logic circuit, an output circuit, and a feedback circuit that are operably coupled to control a maximum level of an output signal from the driver circuit based on an operating threshold of the feedback circuit as set by Vsrc received into a transistor gate of the feedback circuit.

More particularly, within each driver circuit, the logic circuit is configured to receive an input signal into a first input terminal. The output circuit, which is coupled to the logic circuit, is configured to generate at an output terminal of the output circuit, an output signal having a signal level that changes in response to a signal level of the input signal. The feedback circuit, which is coupled to a second input of the logic circuit, comprises first and second gate terminals coupled to the output terminal and a third gate terminal coupled to the control signal supply. The feedback circuit is configured to control a maximum level of the output signal from the driver circuit based on an operating threshold of the feedback circuit as set by the control signal generated by the control signal supply.

The process 600 further comprises forming on the substrate, at 606, a corresponding set of receiving circuits coupled to the output terminal of each driver circuit. In an embodiment each first receiving circuit is formed to have a corresponding operating threshold. Moreover, the control signal supply is formed to generate the control signal having a signal level that causes the maximum level of the output signal of each driver circuit to at least equal the maximum operating threshold of all the corresponding receiving circuits coupled to the driver circuit. In such a case, the control signal is set to satisfy the threshold level of each of the receiving circuits on the substrate.

A driver circuit (in this case a half swing buffer circuit) is described that provides a dynamic power reduction by driving a load capacitance by a maximum output voltage that is smaller than a full rail power supply voltage, VDD, but large enough to meet the voltage requirements of a receiving circuit coupled to receive the output voltage. The maximum output voltage is controlled by setting an external "tuning voltage," Vsrc, which is gate-coupled to a feedback circuit within the driver circuit. The lower power operation is achieved without risking circuit failure due to insufficient output voltage margin. The optimum tuning voltage, Vsrc, can be determined die-specifically during test. Accordingly, maximized dynamic power savings on a particular die is achieved while still providing for safe circuit operation.

Figure 7:
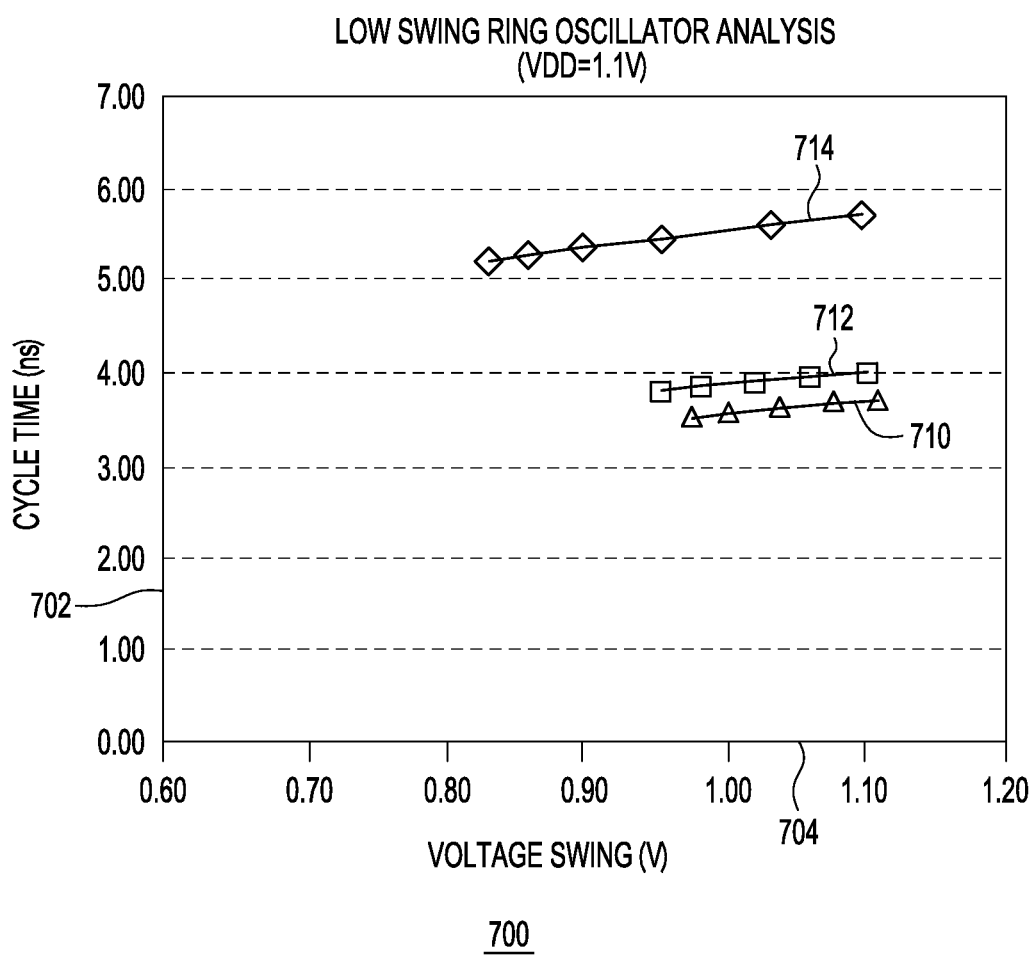
FIG. 7 shows variation of a ring oscillator switching speed with the voltage output level swing for a driver circuit, in accordance with an embodiment.

Moreover, the present teachings can be applied to any receiving circuit that can benefit from dynamic power reduction, including circuits having a high level of dynamic activity, such as ring oscillators and clock trees, without impacting the operation of the receiving circuit. For instance, FIG. 7 illustrates in a plot 700 cycle times 710, 712, and 714 for three different ring oscillator configurations. Plot 700 shows cycle time in nanoseconds on an axis 702 and voltage swing in voltage on an axis 704, wherein the voltage swing is of a driver circuit coupled to the ring oscillators and providing an output signal that is controlled in accordance with the present teachings.

As shown, the cycle time for each ring oscillator configuration varies somewhat with the driver circuit output voltage swing, which results in some frequency dependence of the ring oscillator on the driver circuit output voltage swing. However, the change in cycle time is less than 1% for a modest output voltage swing tuning range, which can be easily accounted for in timing adjustments such as, for instance, using a clock tree application. This small variation of cycle time with voltage swing is demonstrative of the fact that, using the present teachings, circuits can be operated or clocked at similar frequencies with little dependence on or consideration of voltage swing.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

For the sake of brevity, conventional techniques related to semiconductor fabrication (including those using conventional CMOS technology), CMOS devices, MOSFETs, CMOS circuits and architectures, transistors, inverters, voltage regulator circuits, and other functional aspects of the system (and the individual system operating components) are not described in detail. Furthermore, the connecting lines shown in the various figures contained herein are intended to represent example functional relationships and/or physical couplings between the various elements. It should be noted that many alternative or additional functional relationships or physical connections might be present in a practical embodiment. In addition, for ease of discussion, the figures illustrate example, single-ended implementations, but those skilled in the art can adapt illustrated techniques for use in differential signaling applications using the provided guidelines without departing from the scope of the present disclosure.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%.

As used herein, the term "configured to", "configured with", "arranged to", "arranged with", "capable of", "operable to" and any like or similar terms means that referenced circuit elements have an internal physical arrangement (such as by virtue of a particular transistor technology used) and/or physical coupling and/or connectivity with other circuit elements in an inactive state. This physical arrangement and/or physical coupling and/or connectivity (while in the inactive state) enables the circuit elements to perform stated functionality while in the active state of receiving and processing various signals at inputs of the circuit elements to generate signals at the output of the circuit elements.

As further used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The above description refers to nodes or features being "connected" or "coupled" together. As used here and, unless expressly stated otherwise, "coupled" means that one node or feature is directly or indirectly joined to (or is in direct or indirect communication with) another node or feature, and not necessarily physically. As used herein, unless expressly stated otherwise, "connected" means that one node or feature is directly joined to (or is in direct communication with) another node or feature. For example, a switch may be "coupled" to a plurality of nodes, but all of those nodes need not always be "connected" to each other; moreover, the switch may connect different nodes to each other depending on the state of the switch. Furthermore, although the various circuit schematics shown herein depict certain example arrangement of elements, additional intervening elements, devices, features, or components may be present in an actual embodiment (assuming that the functionality of the given circuit is not adversely affected).

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A method for controlling an output signal for a driver circuit, the method comprising:
   receiving, into a driver circuit, an input signal;
   generating, by the driver circuit, an output signal having a signal level that changes in response to a signal level of the input signal;
   receiving the output signal into first and second gate terminals of a feedback circuit for the driver circuit;
   receiving a control signal into a third gate terminal of the feedback circuit, wherein the control signal sets an operating threshold of the feedback circuit in order to control a maximum level of the output signal from the driver circuit, wherein the maximum level of the output signal is adjustable based on a value of the control signal.

2. The method of claim 1, wherein receiving the control signal comprises receiving a continuous level control signal that enables continuous tuning of the maximum level of the output signal using an external reference voltage.

3. The method of claim 1, wherein generating the output signal comprises generating an output signal comprising a voltage level that ranges between the maximum level of the output signal, which is less than a first supply voltage level for the driver circuit and a second supply voltage level for the driver circuit.

4. The method of claim 3, wherein the second supply voltage level is a virtual ground.

5. The method of claim 1, wherein the maximum level of the output signal is greater than an operating threshold of a receiving circuit coupled to the driver circuit.

6. The method of claim 1, wherein the value of the control signal is based on at least one of manufacturing process characteristics or operating environment characteristics of an integrated circuit chip housing the driver circuit.

7. A driver circuit having an adjustable output signal, the driver circuit comprising:
   a logic circuit configured to receive an input signal into a first input terminal;
   an output circuit coupled to the logic circuit, wherein the output circuit is configured to generate, at an output terminal of the output circuit, an output signal having a signal level that changes in response to a signal level of the input signal;
   a feedback circuit coupled to a second input terminal of the logic circuit, the feedback circuit comprising first and second gate terminals coupled to the output terminal and a third gate terminal coupled to a control signal supply, wherein the feedback circuit is configured to control a maximum level of the output signal from the driver circuit based on an operating threshold of the feedback circuit as set by a control signal generated by the control signal supply, wherein a value the control signal determines the maximum level of the output signal from the driver circuit.

8. The driver circuit of claim 7, wherein the feedback circuit comprises a first inverter having an input comprising the first and second gate terminals coupled to the output terminal and an output coupled to the second input of the logic circuit.

9. The driver circuit of claim 8, wherein the first inverter comprises:
   a first transistor comprising the first gate terminal, a first terminal coupled to a first voltage supply, and a second terminal comprising the output of the inverter coupled to the second input of the logic circuit;

a second transistor comprising the second gate terminal, a first terminal coupled to a second voltage supply, and a second terminal; and a third transistor comprising the third gate terminal, a first terminal coupled to the second terminal of the first transistor, and a second terminal coupled to the second terminal of the second transistor.

10. The driver circuit of claim 9, wherein the first and third transistors comprise p-channel metal oxide semiconductor transistors, and the second transistor comprises an n-channel metal oxide semiconductor transistor.

11. The driver circuit of claim 9, wherein the first voltage supply is configured to provide a first supply voltage level, and the second voltage supply is configured to provide a virtual ground voltage level, wherein the driver circuit is configured to generate an output signal comprising a voltage level that ranges from the virtual ground voltage level to the maximum level of the output signal, which is less than the first supply voltage level.

12. The driver circuit of claim 9, wherein the logic circuit comprises:
a NAND logic gate comprising the first and second input terminals of the logic circuit and output; and
a second inverter having an input coupled to the first input terminal of the NAND gate and an output.

13. The driver circuit of claim 12, wherein the output circuit comprises:
a fourth transistor having a first terminal coupled to the first voltage supply, a gate terminal coupled to an output of the NAND logic gate and a second terminal that is the output terminal of the output circuit; and
a fifth transistor having a first terminal coupled to the second voltage supply, a gate terminal coupled to the output of the second inverter and a second terminal coupled to the second terminal of the fourth transistor.

14. The driver circuit of claim 13, wherein the fourth transistor comprises a p-channel metal oxide semiconductor transistor, and the fifth transistor comprises an n-channel metal oxide semiconductor transistor.

15. The driver circuit of claim 9, wherein the first transistor comprises a p-channel metal oxide semiconductor transistor, and the second and third transistors comprise n-channel metal oxide semiconductor transistors.

16. The driver circuit of claim 7, wherein the control signal supply includes a programmable element that is configured to generate a die-specific control signal, wherein the programmable element is programmable using an off-die input signal.

17. The driver circuit of claim 7, wherein the control signal supply comprises a voltage regulator circuit located on a same integrated circuit chip with the driver circuit.

18. The driver circuit of claim 7, wherein the driver circuit is formed on an integrated circuit and is coupled to the control signal supply and to a first receiving circuit formed on the integrated circuit and having a first receiving circuit operating threshold, wherein the control signal supply is configured to generate the control signal having a value that causes the maximum level of the output signal of the driver circuit to be greater than the first receiving circuit operating threshold.

19. The driver circuit of claim 7, wherein the integrated circuit that contains the driver circuit also contains at least one other driver circuit coupled to the control signal supply and at lease one receiving circuit coupled to each of the other driver circuits and having corresponding receiving circuit operating thresholds, wherein the control signal supply is configured to generate the control signal having a value that causes a maximum level of an output signal of each driver circuit to be at least a maximum of all the receiving circuit operating thresholds.

20. A method for manufacturing an integrated circuit on a substrate containing multiple driver circuits each having an adjustable output signal, the method comprising:

forming a control signal supply on the substrate;

forming a set of driver circuits on the substrate, wherein each driver circuit is coupled to the control signal supply, and wherein each driver circuit comprises:
a logic circuit configured to receive an input signal into a first input terminal;
an output circuit coupled to the logic circuit, wherein the output circuit is configured to generate, at an output terminal of the output circuit, an output signal having a signal level that changes in response to a signal level of the input signal;
a feedback circuit coupled to a second input of the logic circuit, the feedback circuit comprising first and second gate terminals coupled to the output terminal and a third gate terminal coupled to the control signal supply, wherein the feedback circuit is configured to control a maximum level of the output signal from the driver circuit based on an operating threshold of the feedback circuit as set by a control signal generated by the control signal supply, wherein a value the control signal determines the maximum level of the output signal from the driver circuit; and forming, on the substrate, a corresponding set of receiving circuits coupled to the output terminal of each driver circuit in the set of driver circuits, wherein each receiving circuit is formed to have an operating threshold, and the control signal supply is formed to generate the control signal having a signal level that causes the level of the output signal of each driver circuit to at least equal a maximum operating threshold of all the corresponding receiving circuits coupled to the driver circuit.

\* \* \* \* \*